US007626116B2

(12) United States Patent
Fetzer et al.

(10) Patent No.: US 7,626,116 B2
(45) Date of Patent: *Dec. 1, 2009

(54) ISOELECTRONIC SURFACTANT SUPPRESSION OF THREADING DISLOCATIONS IN METAMORPHIC EPITAXIAL LAYERS

(75) Inventors: Christopher M. Fetzer, Santa Clarita, CA (US); James H. Ermer, Burbank, CA (US); Richard R. King, Thousand Oaks, CA (US); Peter C. Cotler, Canyon Country, CA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/361,976

(22) Filed: Feb. 23, 2006

(65) Prior Publication Data
US 2009/0145476 A1 Jun. 11, 2009

Related U.S. Application Data

(62) Division of application No. 10/281,302, filed on Oct. 23, 2002, now Pat. No. 7,122,734.

(51) Int. Cl.
*H01L 31/00* (2006.01)
(52) U.S. Cl. ........................ 136/255; 136/256; 136/262
(58) Field of Classification Search ................. 136/243, 136/255–256, 262
See application file for complete search history.

(56) References Cited

U.S. PATENT DOCUMENTS

| 4,667,059 A | 5/1987 | Olson |
| 4,876,210 A | 10/1989 | Barnett et al. |
| 4,963,949 A | 10/1990 | Wanless et al. |
| 5,223,043 A | 6/1993 | Olson et al. |
| 5,231,298 A | 7/1993 | Daly |
| 5,628,834 A | 5/1997 | Copel et al. |
| 5,770,868 A | 6/1998 | Gill et al. |

(Continued)

FOREIGN PATENT DOCUMENTS

GB 2354108 3/2001

(Continued)

OTHER PUBLICATIONS

King et al., "High-Efficiency Space and Terrestrial Multijunction Solar Cells Through Bandgap Control in Cell Structures," Proc. 29$^{th}$ IEEE Photovoltaic Specialists Conf., May 20-24, 2002.

(Continued)

*Primary Examiner*—Jeffrey T. Barton
(74) *Attorney, Agent, or Firm*—Hope Baldauff Hartman, LLC

(57) ABSTRACT

A method of reducing propagation of threading dislocations into active areas of an optoelectronic device having a III-V material system includes growing a metamorphic buffer region in the presence of an isoelectronic surfactant. A first buffer layer may be lattice matched to an adjacent substrate and a second buffer layer may be lattice matched to device layers disposed upon the second buffer layer. Moreover, multiple metamorphic buffer layers fabricated in this manner may be used in a single given device allowing multiple layers to have their band gaps and lattice constants independently selected from those of the rest of the device.

44 Claims, 7 Drawing Sheets

U.S. PATENT DOCUMENTS

| | | | |
|---|---|---|---|
| 5,997,638 | A | 12/1999 | Copel et al. |
| 6,139,629 | A | 10/2000 | Kisielowski et al. |
| 6,316,715 | B1 | 11/2001 | King et al. |
| 6,340,788 | B1 | 1/2002 | King et al. |
| 6,426,522 | B1 | 7/2002 | Kean et al. |
| 6,815,736 | B2 | 11/2004 | Mascarenhas |
| 2001/0040244 | A1 | 11/2001 | Fitzgerald et al. |
| 2001/0047751 | A1 | 12/2001 | Kim et al. |
| 2002/0005514 | A1 | 1/2002 | Fitzgerald |
| 2004/0065363 | A1 | 4/2004 | Fetzer et al. |
| 2004/0200523 | A1 | 10/2004 | King et al. |

FOREIGN PATENT DOCUMENTS

| | | |
|---|---|---|
| GB | 2358959 A | 8/2001 |
| JP | 2001-156301 A | 6/2001 |
| WO | WO 99/14809 A1 | 3/1999 |

OTHER PUBLICATIONS

Dimroth et al., "25.5% Efficient $Ga_{0.35}In_{0.65}P/Ga_{0.83}In_{0.17}As$ Tandem Solar Cells Grown on GaAs Substrates," IEEE Electron Device Lett., vol. 21, p. 209 (2000)].

King et al., "Metamorphic GaInP/GaInAs/Ge Solar Cells," Proc. 28th IEEE Photovoltaic Specialists Conf. (IEEE, New York, 2000), p. 982.

Massies et al. "Surfactant mediated epitaxial growth in $In_xGa_{1-x}As$ on GaAs (001)," Appl. Phys. Lett., vol. 61 (1992) p. 99.

Shimizu et al. in "1.2 μm Range GaInAs SQW Lasers Using Sb as Surfactant," Electron Dev. Lett., vol. 36, (2000) p. 1379.

Yang, et al., "Molecular beam epitaxial growth of InGaAsN:Sb/GaAs quantum wells for long-wavelength semiconductor lasers", Applied Physical Letters, Jul. 12, 1999, vol. 75, No. 2, pp. 178-180.

Yang, et al., "High performance 1.3 um InGaAsN:Sb/GaAs quantum well lasers grown by molecular beam epitaxy", J. Vac. Sci. Technol. B 18(3), May/Jun. 2000, pp. 1484-1487.

Liu et al., "High-quality Ge films on Si substrates using Sb surfactant-mediated graded SiGe buffers," Appl. Phys. Lett., vol. 79, No. 21, Nov. 19, 2001 (3431).

Tournie et al., "Surfactant-mediated molecular-beam epitaxy of highly strained III-V semiconductor heterostructures," Conference Proceddings of the Sixth International Conference on Indium Phosphide and Related Materials, Mar. 27-31, 1994, pp. 49-52.

Yuan et al., "Characterization of linearly graded metamorphic InGaP buffer layers on GaAs using high-resolution X-ray diffraction," Thin Solid Films, vol. 391, pp. 36-41, 2001.

Lee et al., "Enhancement of compositional modulation in GaInP epilayers by the addition of surfactants during organometallic vapor phase epitaxy growth," Journal of Crystal Growth, vol. 233(3), pp. 490-502, 2001.

Shurtleff et al., "Time dependent surfactant effects on growth of GaInP heterostructures by organometallic vapor phase epitaxy," Journal of Crystal Growth, vol. 234, pp. 327-336, 2001.

Wang et al., "Metamorphic InP/InGaAs heterojunction bipolar transistors on GaAs substrate: DC and microwave performances," IEEE Transactions on Electron Devices, vol. 48(12), Dec. 2001, pp. 2671-2676.

Matthews et al., "Defects in Epitaxial Multilayers", Journal of Crystal Growth, vol. 27, pp. 118-125, 1974.

ISOELECTRONIC SURFACTANT SUPPRESSION OF THREADING DISLOCATIONS IN METAMORPHIC EPITAXIAL LAYERS

CROSS REFERENCE TO RELATED APPLICATIONS

The present application is a divisional application of patent application Ser. No. 10/281,302, filed Oct. 23, 2002, now U.S. Pat. No. 7,122,734.

GOVERNMENT RIGHTS

This invention was made with Government support under contract no. F29601-98-2-0207 awarded by the U.S. Air Force. The government has certain rights in this invention.

BACKGROUND OF THE INVENTION

The present invention generally relates to semiconductor materials and to a method of reducing the propagation of threading dislocations from plastic deformation in mismatched epitaxial layers into active areas of optoelectronic devices and, more particularly, to a method for reducing the propagation of such dislocations for solar energy conversion and other photovoltaic devices.

The interest in photovoltaic (PV) cells in both terrestrial and non-terrestrial applications continues as concerns over pollution and limited resources increases. Irrespective of the application, and as with any energy generation system, efforts have been ongoing to increase the output and/or increase the efficiency of PV cells. To increase the electrical power output of such cells, multiple subcells comprising layers having different energy band gaps have been stacked so that each subcell or layer can absorb a different part of the wide energy distribution in the sunlight. This situation is advantageous, since each photon absorbed in a subcell corresponds to one unit of charge that is collected at the subcell operating voltage, which is approximately linearly dependent on the band gap of the semiconductor material of the subcell. An ideally efficient solar cell would have a large number of subcells, each absorbing only photons of energy negligibly greater than its band gap.

Many optoelectronic devices are formed by thin film epitaxial growth of III-V compound semiconductors upon a mechanical substrate. This substrate—typically of GaAs, InP, Ge or other bulk material—acts as an atomic template for the formation of the epitaxial layers. The atomic spacing or lattice constant in the epitaxial layers is typically fixed by that of the substrate.

Devices are formed only at or near the lattice constant of an available substrate material. FIG. 1 shows the band gap of binary materials connected by lines of ternary alloys (e.g., InGaAs is a line between GaAs and InAs), as well as showing the lattice constants for most common substrate materials. A basic problem is that devices are optimal for applications in regions of band gap where there is no available substrate. For example, the theoretically most efficient solar cells are composed of alloys with band gaps that have lattice constants between GaAs and InP substrates. A similar dilemma continues to most optoelectonic devices—such as lasers, LEDs, HBTs, and others—where the most suitable band gaps are not the ones easily available near a lattice constant of an available substrate.

Another restriction this imposes is in the cost of the available substrates for a given device. For example, InP is available, but is very costly and may make certain optoelectronic designs too expensive to be commercially practical. There are two main approaches to overcoming this restriction. One approach is to grow layers that are lattice-mismatched to the substrate, but are thin enough that they are fully-strained, i.e., unrelaxed. Such layers are known as pseudomorphic layers. In such layers, the band gap and other properties may be adjusted by virtue of the ability to alter the lattice constant and semiconductor composition, as well as by the strain state of the pseudomorphic layers, thereby allowing the device performance to be improved. But the thickness of these layers that can be grown before plastic deformation occurs is typically limited. A second approach is to grow an inactive buffer that is completely or nearly completely relaxed, and then growing the rest of the device on top of this layer as if it were a substrate with a new lattice constant. These layers which transition from the lattice constant of the growth substrate to a new lattice constant upon which strain-free layers can be grown are known as metamorphic layers. In general, devices grown with such intentionally relaxed layers are known as metamorphic devices.

Pseudomorphic layers are routinely used in optoelectronics to enhance performance in all device types. The device designs are limited to layers where no relaxation or limited relaxation has occurred and thus limited to certain amounts of strain and thickness. That strain and thickness relationship is typically dictated by the Matthews-Blakeslee relationship (described in Matthews, J. W. and Blakeslee, A. E.: "Defects in epitaxial multilayers, I. Misfit dislocations", J. Crystal Growth, 1974, 27, pp. 118-125 and incorporated herein by reference) which describes the equilibrium thickness, which may be exceeded depending on kinetics. In the Matthews-Blakeslee model, dislocation formation occurs when an epilayer exceeds a critical strain energy density. Once formed, dislocations move as an atomic level crack through the remaining epitaxial layers in a form known as a threading dislocation. When plastic deformation occurs, it may occur to a limited degree (partial relaxation) or completely (total relaxation). Both are generally termed as "metamorphic" layers.

In epitaxy, when a layer relaxes, it does so by forming edge dislocations at the boundary between the strained layer and the substrate. The conventional view of the process is called the dislocation glide model. As the thickness of the growing mismatched layer increases, the surface strain increases. When the strain energy reaches a critical value, the layer begins to relax by forming a loop or ½ loop made up of two threading dislocation segments and an edge dislocation segment at the free surface of the strained layer. In vapor-phase epitaxy, this free surface is the growth front or solid-vapor interface. The loop then propagates the edge dislocation to the strain layer/unstrained layer interface where the edge segment stops. The threading segments extend from that interface to the free surface. Continued growth of the mismatched layer builds additional strain. Simultaneously, the additional strain may be relieved by the extension of the existing edge segments or by the formation of more dislocation loops. Once formed, the threading dislocations then propagate throughout the rest of the growth layers, whether the layers exceed the critical strain energy or not. In other words, the defects become a permanent feature of the upper epitaxial layers. Understanding how to control this relaxation and the limitation it presents is essential in growing mismatched epitaxial layers.

The density of edge-dislocations required for 100% relaxation at the strain layer/unstrained layer interface is determined by the difference in lattice constant of the two layers.

The number or density of loops is a kinetic or rate problem. The final threading dislocation density generated is determined by the balance between the extension of existing dislocation loops and the nucleation of new loops. One may extend the thickness and/or strain of a pseudomorphic mismatched layer beyond that described by the Matthews-Blakeslee limit by slowing down this rate of loop formation.

The presence of threading dislocations in the active regions of a device may act as a loss mechanism, degrading the performance of the device. Unbonded atoms at threading dislocations act as recombination centers reducing the minority-carrier lifetime in the device active regions. This is especially true for devices where minority carrier lifetime is important such as photovoltaic (PV) cells, laser diodes (LDs), light emitting diodes (LEDs), and heterojunction bipolar transistors (HBTs). The need for low recombination rates in such devices usually necessitates that these devices be grown at lattice-matched conditions. However, if the layer is thin enough, no dislocations are formed. This thickness requirement restricts the usefulness of intentionally engineering the strain within a given device to near atomic layer dimensions for large strains. Alternatively, for thicker epitaxial structures required for entire devices, the mismatch in lattice constant must be very small. Typically, the in-plane strain, $\epsilon_\parallel$, is limited by $\epsilon_\parallel < 0.1\%$, where $\epsilon_\parallel$ is of a mismatched epitaxial layer defined by $\epsilon_\parallel = |a_{layer} - a_{substrate}|/a_{layer}$, and where $a_{layer}$ and $a_{substrate}$ are unstrained lattice constants of the layer and substrate, respectively.

One may attack the problem of strained, mismatched active device layers by controlling the growth conditions and composition to keep the designed layers below the strain and thickness parameters. As stated above, this limits the available alloys and thicknesses for device designs and may be highly disadvantageous for device performance. The other extreme in this problem is to intentionally form 100% relaxed layers, but confine the relaxation to inactive regions of the device. This method is the metamorphic buffer layer approach. In this method, layers are grown in a manner that "forces" relaxation to occur, such as growing at large mismatches and thicknesses. The remaining layers are grown lattice-matched to this new lattice constant. The drawback to this method is that forcing the relaxation to occur typically leads to large densities of threading dislocations in the remaining layers, which then propagate into the upper, active regions of the device, lowering performance of any device grown on top of it. Many methods of prior art exist in attempting to control the density of dislocations in the active regions of metamorphic devices.

A general method that has been found to minimize the threading dislocation density in a metamorphic device is to grow a buffer layer with a graded lattice constant. The strain at the surface during growth may be kept less than one percent with respect to the already relaxed portion of the grade. This low strain typically produces relaxation by the dislocation glide mechanism rather than the three-dimensional islanding often seen at high strains. Minimization of threading dislocation density is a complicated optimization process as evidenced by Fitzgerald et al in U.S. Patent Application No. US2001/0040244. The rates of dislocation glide, dislocation pinning and dislocation nucleation are all dependent on the chosen process parameters. The rates generally increase with temperature, but it is the competition between them which determines the result. Thus, process design to obtain low dislocation density is not straight forward. Other design parameters such as heavy ($>\sim 10^{18}$ cm$^{-3}$) n-type doping may affect the structure by hardening the material, hindering both dislocation glide and possibly nucleation.

Multijunction photovoltaic cells are a specific category of optoelectronic devices that would benefit strongly from the freedom to choose semiconductor band gaps for its constituent layers, independent of the band gaps of semiconductor compositions that can readily be grown on available growth substrates such as Ge, GaAs, InP, Si, and GaSb. Lattice-matched 2-junction GaInP/GaAs solar cells [Olson, U.S. Pat. No. 4,667,059; Olson and Kurtz, U.S. Pat. No. 5,223,043] and 3-junction GaInP/GaInAs/Ge solar cells [King et al., "High-Efficiency Space and Terrestrial Multijunction Solar Cells Through Bandgap Control in Cell Structures," *Proc. 29$^{th}$ IEEE Photovoltaic Specialists Conf,* May 20-24, 2002] have been described in the literature. Lattice-mismatched 2-junction GaInP/GaInAs/GaAs cells [Dimroth et al., "25.5% Efficient $Ga_{0.35}In_{0.65}P/Ga_{0.83}In_{0.17}As$ Tandem Solar Cells Grown on GaAs Substrates," IEEE Electron Device Lett., Vol. 21, p. 209 (2000)] and lattice-mismatched 3-junction GaInP/GaInAs/Ge solar cells [King et al., "Metamorphic GaInP/GaInAs/Ge Solar Cells," *Proc. 28th IEEE Photovoltaic Specialists Conf.* (IEEE, New York, 2000), p. 982] have also been described. Additionally, lattice-mismatched multi-junction cells with III-V subcells combined with an active silicon substrate, such as 3-junction Gain P/GaInPAs/Si cells; transparent, graded buffer layers such as GaPAs or GaInP to transition from the substrate lattice constant to the device lattice constant in such cells; and multiple graded buffer layers placed between upper and lower subcells, as well as between substrate and lower subcells, to provide maximum flexibility in subcell lattice constant and band gap, are also described in the literature [King et al., U.S. Pat. No. 6,340,788]. All of the above lattice-mismatched multijunction photovoltaic cell designs have a need for, and would benefit from, a structure or method which inhibits propagation of dislocations from the metamorphic (lattice-transitioning) layers into the active regions of the device, since these dislocations act to reduce minority-carrier lifetime, and thereby reduce photovoltaic cell performance.

In the case of 2- or 3-junction (2J or 3J) GaInP/GaInAs/Ge solar cells, the entire epitaxial stack is typically grown at or near lattice-matched conditions with respect to the Ge substrate. In terms of the epitaxial materials, this means limiting the indium content to approximately 1 atomic percent in the GaInAs layers and keeping the indium content of the GaInP layers to near 49.5 atomic percent, +/−1 percent. Since the epitaxial layers are much thicker than the critical thickness for threading dislocation formation, strong deviation from these alloy concentrations leads to losses of open circuit voltage ($V_{oc}$), voltage at maximum power ($V_{mp}$), fill factor, and hence, of efficiency. However, the band gaps of GaInAs and GaInP grown lattice-matched to a Ge (or GaAs) substrate are not exactly tuned to the solar spectrum to produce the most efficient device possible. If GaInAs and GaInP can be grown at a different lattice constant than that of the Ge substrate, thereby modifying the GaInAs and GaInP subcell bandgaps, the photovoltaic conversion of the space and terrestrial solar spectra is theoretically much more efficient. The maximum theoretical AM0 efficiency for GaInP/GaInAs/Ge triple-junction solar cells in which the top and middle subcells are lattice-matched to each other is approximately 38%, attained at a GaInAs middle cell indium content of 12%, i.e., a $Ga_{0.40}In_{0.60}P/Ga_{0.88}In_{0.12}As/Ge$ triple-junction solar cell. These intentionally lattice-mismatched devices are categorized as metamorphic photovoltaics. These mismatched structures are considerably less mismatched than the structures of other metamorphic InGaAs devices. The demands for structural perfection in minority-carrier devices such as solar cells are higher than those for most other devices.

Solar cell device performance is a good indicator of relative defect density in the epitaxial layers. The open circuit voltage ($V_{oc}$) is determined by the minority-carrier lifetime through the relationship:

$$V_{oc} = \frac{nkT}{q} \ln\left(\frac{J_{sc}}{J_{sat}} + 1\right)$$

where k is the Boltzmann constant, T is the temperature, q is the electronic charge, $J_{sc}$ is the short circuit current density, n is the diode ideality factor, and $J_{sat}$ is the saturation current density of the diode which depends directly on the minority-carrier lifetime. Since the minority-carrier lifetime depends strongly on the relative defect density, so will the open-circuit voltage. Similar relations follow for other device parameters such as fill factor (FF), and short circuit current ($J_{sc}$). Small changes in open-circuit voltage result from an exponential change in defect density. Qualitatively, an increase in dislocation density decreases all of the basic solar cell parameters in illuminated current-voltage (I-V) measurements: $V_{oc}$, FF, and $J_{sc}$.

Previous research into middle-cell-active-only $Ga_{0.88}In_{0.12}As$ epitaxial layers grown on a relaxed buffer layer graded from the Ge lattice constant to that of the middle cell has shown that the best performing devices lose 200 mV of voltage as compared to the lattice-matched cells. Only 100 mV of loss is expected due to the reduction of band gap due to the increased indium. Additionally, the cells lose fill factor as well. These effects demonstrate the losses in performance due to recombination in threading dislocations propagating into the middle cell from the relaxed GaInAs buffer layer. Overall, these losses combine to limit the performance of full 3J metamorphic devices to approximately 27 to 28 percent efficient, much less than the theoretical predictions for no-loss devices.

There has been considerable interest in the growth of highly mismatched epilayers in both the SiGe and III-V material systems. Typical attempts to grow highly strained epilayers result in a transition to three-dimensional growth "islanding" after a few monolayers soon after exceeding the Matthews-Blakeslee thickness.

A method of avoiding this "islanding" in the system of Ge on a Si substrate has been discovered by Copel et al., U.S. Pat. No. 5,628,834. They show the use of dopants in Ge and Si such as arsenic or antimony, which act as surfactants, to maintain two-dimensional growth of highly strained Ge/Si structures at temperatures between 400 and 700° C., with greater layer thicknesses than possible by other methods. However, Copel et al. use surfactants in the system of Ge on a Si substrate where the Ge layer exceeds 3 to 6 monolayers. Accordingly, the process by Copel et al. is used for extremely lattice-mismatched layers where large strains cause a transition to islanding growth. But there is no suggested application to significantly different material systems or to layers with small strains to maintain pseudomorphic layers and control plastic extended-line defect nucleation.

In III-V semiconductor growth, dopants have been used as surfactants in work performed by Massies et al. "Surfactant mediated epitaxial growth of $In_xGa_{1-x}As$ on GaAs (001)," *Appl. Phys. Lett.*, Vol. 61 (1992) p. 99, where tellurium, an n-type dopant in III-V semiconductors, was added to InGaAs to extend the critical thickness of the epitaxial layers. Tellurium has been seen as the analog in III-V systems to the antimony used in the group-IV SiGe system, since they are both n-type dopants in these respective semiconductor systems, which interact strongly with the surface. Both also strongly segregate at the growing surface of growing films. This analogy was reinforced by the failure of tin, an isoelectronic element in group-IV systems, which segregates on the growing surface of Si to suppress islanding in the SiGe system.

In a variation of this method, U.S. Pat. No. 6,139,629 to Kisielowski et al. disclose the use of bismuth and similar group-V atoms to reduce the growth temperature for high-quality group-III/nitride (III-N) semiconductors. As disclosed, bismuth acts to reduce the onset of islanding growth in III-N epitaxy at reduced growth temperatures. Again, however, there is no suggested application to small strains to maintain pseudomorphic layers and control plastic extended-line defect nucleation. A similar idea of using an isoelectronic surfactant to extend the two-dimensional growth regime of III-V semiconductors has been used in extending the strain in InGaAs and InGaAsN quantum wells for laser diodes by Shimizu et al. in "1.2 µm Range GaInAs SQW Lasers Using Sb as Surfactant," *Electron Dev. Lett.*, Vol. 36, (2000) p. 1379, and references therein. However, the authors never offer that an isoelectronic surfactant changes the dislocation kinetics. In other words, they do not teach the application of this work to metamorphic, relaxed epitaxial layers. They only deal directly in applying the idea to create highly strained, unrelaxed layers. Their principal observation is that the Sb suppresses the transition to three-dimensional growth.

Another attempt to minimize threading dislocations is shown by Liu et al., "High-quality Ge films on Si substrates using Sb surfactant-mediated graded SiGe buffers," *Appl. Phys. Lett.*, Vol. 79, No. 21, 19 Nov. 2001 (3431). The graded SiGe films were grown at about 500° C., and Sb was used as an n-type dopant surfactant. Conditions were expected to result in a highly n-doped SiGe buffer. Liu et al., however, did not suggest applying the process beyond their IV-IV material system to other material systems, such as a III-V material system. Their explanation of the effect is that the n-type surfactant aids the motion of the misfit dislocations. They did not suggest that any surfactant would have an impact upon the dislocation nucleation kinetics.

An excellent overview of the current state of the art of processes to maintain a low threading location density and relaxed growth template in III-V semiconductors by fabrication of relaxed InGaAs buffers on GaAs substrates is disclosed in U.S. Patent Application No. US2001/0040244 to Fitzgerald. The disclosed process utilizes metalorganic chemical vapor deposition (MOCVD) to grow the relaxed graded layers at a temperature ranging upwards from about 600° C. However, Fitzgerald does not suggest the use of surfactants (e.g., Te) for n-type doping even though the disclosure follows after Copel et. al. and Liu et. al. which teach the use of surfactant doping. A similar discussion of the growth of InGaP/GaP alloys is given in is given in Kim and Fitzgerald US2001/0047751.

As can be seen, there is a need for a method of reducing the propagation of threading dislocations from plastic deformation in mismatched epitaxial layers into active areas of optoelectronic devices, particularly III-V devices. Such a method preferably can be applied to improve the performance of devices utilizing metamorphic layers. Further, such a method preferably can be applied to reduce substrate costs by improving the performance of lattice-matched layers upon poorer quality or less expensive substrates.

SUMMARY OF THE INVENTION

In one aspect of the invention, a method of reducing propagation of threading dislocations into active areas of a III-V optoelectronic device includes growing a plurality of isoelectronic-surfactant-mediated sublayers of a buffer layer, each of the plurality of sublayers of the buffer layer being grown in the presence of an isoelectronic surfactant.

In a further aspect of the invention, a method of fabricating a metamorphic layer of a III-V optoelectronic device includes introducing an isoelectronic surfactant before growing the metamorphic layer; growing the metamorphic layer; and removing the surfactant after the metamorphic layer is grown.

In a still further aspect of the invention, a method of fabricating a metamorphic layer of a III-V optoelectronic device includes introducing an isoelectronic surfactant during a pause after a growth of a buffer layer lattice matched to a substrate; growing the metamorphic layer; and removing the surfactant after the metamorphic layer is grown.

In another aspect of the invention, a surfactant-mediated metamorphic buffer layer is grown, an active device layer or multiple active device layers are then grown, and another surfactant-mediated metamorphic buffer layer is grown, and further device layers are grown. The active device layers may or may not be grown in the presence of the surfactant used in the metamorphic buffer layers.

In another aspect of the invention, a III-V solar cell includes a substrate; a buffer layer having a plurality of isoelectronic-surfactant-mediated, lattice-mismatched layers disposed on the substrate; and a device layer disposed in such manner that the buffer layer is disposed intermediate the substrate and device layer.

In yet another aspect of the invention, a satellite system includes a satellite and a plurality of III-V solar cells, each solar cell including a substrate; a buffer region having a plurality of isoelectronic-surfactant-mediated layers disposed on the substrate; and a device layer disposed in such a manner that the buffer region is disposed intermediate the substrate and device layer.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Figure 7:
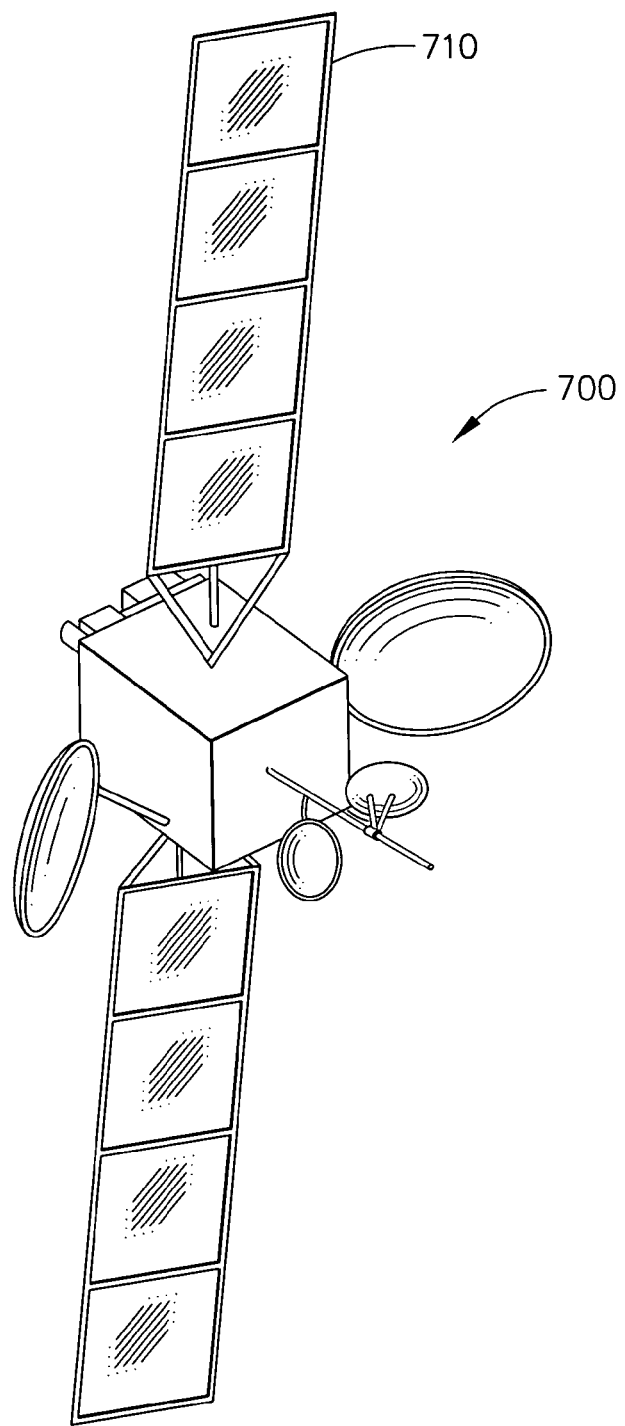
FIG. 7 depicts a satellite utilizing the present invention.

The present invention can be employed in both terrestrial and non-terrestrial applications. For example, the present invention can be employed as a solar cell of a solar array 710 on a satellite 700 (FIG. 7). Further, while the present invention can be exemplified in terms of a photovoltaic cell, the present invention is not so limited and may generally extend to optoelectronic and electronic devices such as a light emitting diode, a laser diode, a solar cell, an avalanche photodiode, a p-type/intrinsic/n-type (pin) diode, a heterojunction bipolar transistor, a homojunction bipolar transistor, a high-electron mobility transistor, and a field effect transistor. In particular, the present invention is useful for III-V material systems.

Generally, the present invention includes a method of controlling the rate of nucleation of the dislocation loops at the surface of device layer by introducing an isoelectronic surfactant during the growth of that layer. Although not intended to be limited by theory, the presence of a surfactant may slow down the formation rate of the dislocation loops. In the case of a metamorphic buffer layer, the present invention may force more relaxation to occur with fewer loops. The segments of edge dislocations become as long as possible with fewer threading dislocations than achieved by other methods. This also means that the threading segments are forced to the outer edge of the wafer which are discarded in normal processing and so are outside of the device active regions. The conventional wisdom implies that only n-type dopants may act as surfactants, such Liu et al. above use an n-type dopant Sb in group-IV semiconductors. The direct extrapolation of this is to use an n-type dopant such as Te in III-V alloys. However, the present invention teaches away from this direct extrapolation.

Broadly, and in one aspect of the present invention, a method of reducing propagation of threading dislocations into active areas of an optoelectronic device includes growing a plurality of layers of a buffer region, each of the plurality of layers of the buffer region being grown in the presence of an isoelectronic surfactant. The isoelectronic surfactant is not one that is intended to change the charge-carrier (electron or hole) concentration through doping. Rather, the isoelectronic surfactant operates to create relaxed buffer layers. This is in contrast to the prior art which uses a surfactant but does so changing the charge-carrier concentration in a layer such as a buffer layer, or uses an isoelectronic surfactant to create unrelaxed, pseudomorphic layers. By employing the method of the present invention, metamorphic layers may be grown with reduced threading dislocations in active layers of a device.

Multijunction Photovoltaic Cells

The present invention may be used in single-junction or multijunction solar cells, as an example, and preferably in a buffer layer of such cells. The present invention may be used in a homojunction cell or subcell, i.e., a cell or subcell in which the p-n junction is formed between a p-type semiconductor and an n-type semiconductor both of which have the same chemical composition of the matrix semiconductor and the same band gap, differing only in the dopant species and type. The present invention may also be used in a heterojunction cell or subcell, i.e., a cell or subcell in which the p-n junction is formed between a p-type semiconductor and an n-type semiconductor having different chemical compositions of the matrix semiconductors in the p-type and n-type regions, and/or different band gap energies in the p-type and n-type regions, in addition to the different dopant species and type in the p-type and n-type regions that form the p-n junction.

Figure 2:
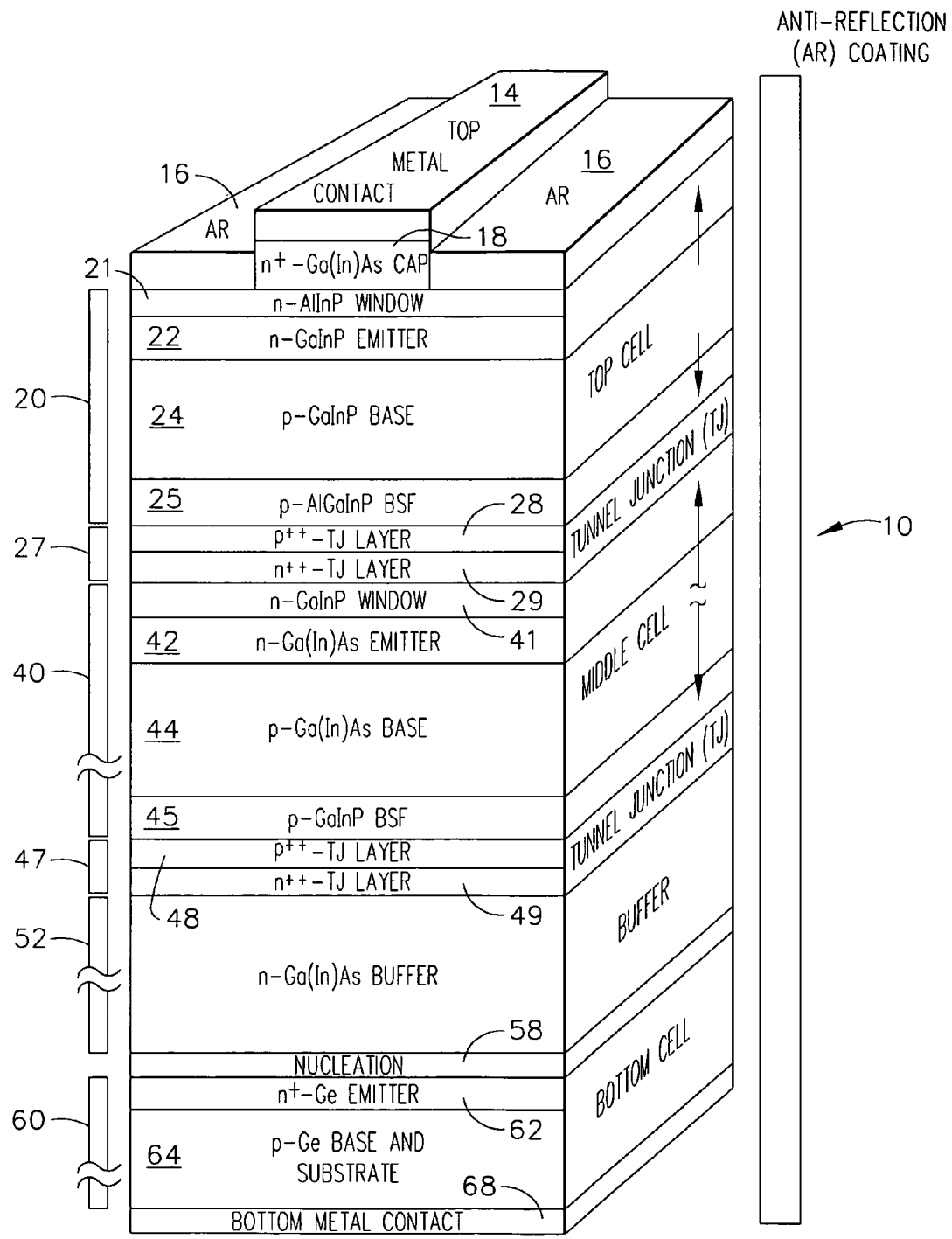
FIG. 2 is a cross sectional view of a 3-junction photovoltaic cell according to an embodiment of the invention.

The present invention may be used in any or all of the subcells in a multijunction (MJ) photovoltaic cell. FIG. 2 depicts a cross-section of a MJ cell 10 representing one embodiment of the present invention having three subcells, 20, 40, and 60, connected in electrical series. The subcells 20, 40, 60 that form the MJ cell 10 are referred to according to the material of their respective base layer 24, 44, and 64. For instance, in FIG. 2, the multijunction cell 10 may be composed of a GaInP subcell 20 with a GaInP base layer 24, a Ga(In)As subcell 40 with a Ga(In)As base layer 44 (where the parentheses around In indicate that the base may be composed of GaInAs with Indium of varying degree from 0% In, GaAs, to 100% Indium, InAs), and a Ge subcell 60 with a Ge base layer 64 composed of a Ge growth substrate.

The subcells 20, 40, and 60 may also be referred to by the order in which light strikes each subcell as it enters the front of the MJ cell 10. For instance in FIG. 2, the subcell 10 may also be referred to as the top subcell or subcell 1, the subcell 40 may be referred to as the middle subcell or subcell 2, and the Ge subcell 60 as the bottom subcell or subcell 3. In general, n subcells may be connected in series, where n may be equal to 1 for a single-junction cell, or n may be any integer greater than or equal to 2 for a multijunction cell. The growth substrate may be electrically inactive or, it may be electrically active, thereby forming one of the n subcells in the multijunction cell.

For example, in FIG. 2, the Ge subcell 60 may be formed from the germanium wafer that serves as a substrate for epitaxial growth of the semiconductor layers that form the upper subcells, and as the main mechanical support for the cell, in addition to serving as one of the three active subcells in the 3-junction cell 10. The epitaxial growth of semiconductor layers on the substrate can be initiated with a nucleation layer 58, and a buffer region 52, which may contain one or more semiconductor layers, is typically grown between the nucleation layer 58 and the lowermost epitaxial subcell (in FIG. 2, this is the middle cell 40). The tunnel junction between the lowermost epitaxial subcell and the substrate may be placed either above, beneath, or in the body of a buffer region. In FIG. 2, the tunnel junction 47 is shown above the buffer region 52.

A tunnel junction 27 may connect the top subcell 20 and the middle subcell 40 in electrical series, and another tunnel junction 47 may connect the middle subcell 40 and the bottom subcell 60 in electrical series. In general, each of the n subcells in a MJ cell 10 may be connected in series to the adjacent subcell(s) by a tunnel junction, in order to form a monolithic, two-terminal, series-interconnected multijunction cell. In this two-terminal configuration, it is desirable to design the subcell thickness' and band gaps such that each subcell has nearly the same current at the maximum power point of the current-voltage curve of each subcell, in order that one subcell does not severely limit the current of the other subcells. Alternatively, the subcells may be contacted by means of additional terminals, for instance, metal contacts to laterally conductive semiconductor layers between the subcells, to form 3-terminal, 4-terminal, and in general, m-terminal MJ cells where m is an integer greater than or equal to 2 (the case of m=2 is the special case of the two-terminal series-interconnected cell described above), and less than or equal to 2n, where n is the number of active subcells in the MJ cell. The subcells can be interconnected in circuits using these additional terminals such that most of the available photogenerated current density in each subcell can be used effectively, leading to high efficiency for the MJ cell, even if the photogenerated current densities are very different in the various subcells.

The window, emitter, base, and back-surface field (BSF) layers are shown in each of the subcells 20, 40, and 60 in FIG. 2. The window, emitter, base, and BSF layers in the top cell 20 are layers 21, 22, 24, and 25, respectively, and in the middle cell 40 they are layers 41, 42, 44, and 45, respectively.

As shown in FIG. 2, the nucleation layer 58 can also serve as a window layer for the bottom cell 60. The buffer region 52 can also be considered as part of the window of the Ge subcell 60, though it has other functions as well, such as reducing crystal defects and improving morphology in the upper epitaxially-grown layers of the MJ cell 10. The emitter layer 62 of the Ge subcell 60 in FIG. 2 is formed by diffusion into the p-type Ge substrate of column-V elements (which are n-type dopants in Ge) from the epitaxial growth of the III-V semiconductors on top of the Ge substrate. The base 64 of the Ge subcell 60 consists of the bulk of the p-type Ge wafer which also serves as the growth substrate and mechanical support for the rest of the MJ cell 10. No BSF layer is shown at the back of the Ge subcell 60 in FIG. 2. However, a BSF layer such as a diffused $p^+$ region, or an epitaxially-grown group-IV or III-V semiconductor layer, on the back of the Ge subcell 60 is certainly an option in MJ cell technology, and would also help to improve the efficiency of the Ge subcell 60, as well as the overall MJ cell 10 efficiency.

The photogenerated current leaves the respective subcell through contacting layers, which are typically heavily-doped semiconductor layers, but may be composed of other types of conductive material, such as conductive oxides or metal, which may be transparent or opaque over different wavelength ranges. The contacting layers for the top subcell 20 in FIG. 2 can be the cap layer 18 on the front of the subcell 20 (which in turn is contacted by the metal grid pattern 14 on the top of the MJ cell 10), and the $p^{++}$-doped side 28 of the tunnel junction 27 on the back surface of the top subcell 20. The contacting layers for the middle subcell 40 in FIG. 2 can be the $n^{++}$-doped side 29 of the tunnel junction 27 on front of the middle subcell 40, and the $p^{++}$-doped side 48 of the tunnel junction 47 on the back surface of the middle subcell 40. The contacting layers for the Ge bottom subcell 60 in FIG. 2 can be the $n^{++}$-doped side 49 of the tunnel junction 47 on front of the buffer region 52 (provided that the buffer region 52 is considered to be part of the window structure for the Ge subcell 60), and the back metal contact 68 on the back surface of the bottom subcell 60 (which is also the back surface of the entire MJ cell 10).

The contacting layers may be unpatterned, as in the case of the back metal contact 68 on the bottom subcell 60, or a transparent conductive oxide contacting the top cell window 21 or emitter 22, in place of the more conventional solar cell grid. The contacting layers may also be patterned, as in the case of the patterned heavily-doped cap 18 and metal contact 14 that form the front grid of most solar cells, as shown in FIG. 2.

Figure 1:
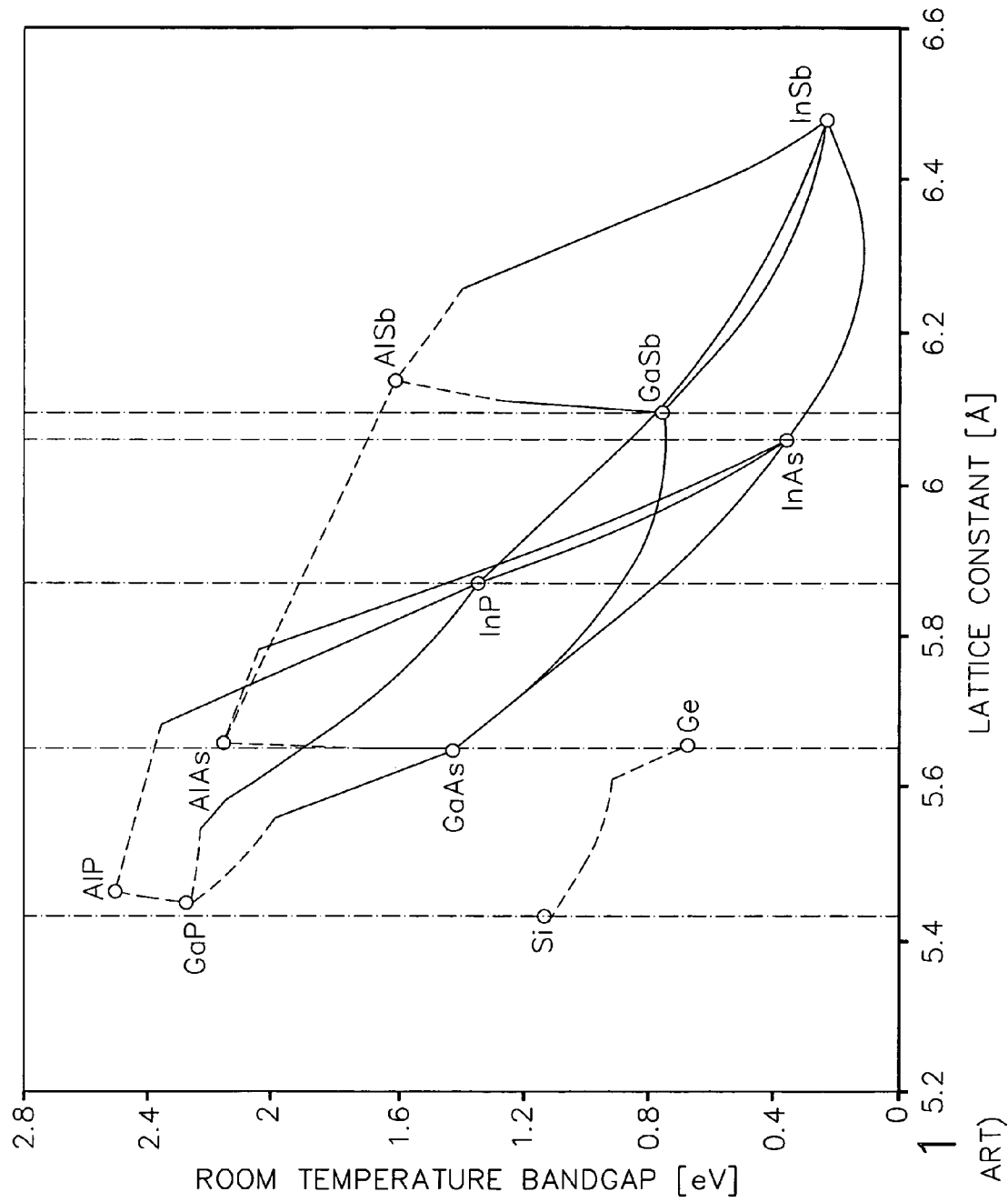
FIG. 1 is a lattice constant/band gap relational diagram.

The lateral conductivity of the emitter and window layers between gridlines is important, since after minority carriers in the base (minority electrons in the case of the p-type top cell base shown in FIG. 2) are collected at the base/emitter p-n junction between the gridlines, the collected carriers, which are now majority carriers in the emitter (majority electrons in the n-type top cell emitter in FIG. 2), should be conducted to the gridlines with minimum resistive loss. Both the top cell emitter layer 22 and window layer 21 may take part in this lateral majority-carrier conduction to the gridlines. While maintaining this high conductivity, the window 21 and emitter layers 22 should remain highly transmissive to photon energies that can be used effectively by the base 24 of the top cell 20 and by the other active subcells 40, 60 in the MJ cell 10, and/or should have a long diffusion length for minority-carriers that are photogenerated in the window 21 and emitter layers 22 (minority holes in the case of the n-type emitter shown in FIG. 1), so that they may be collected at the p-n junction before recombining. Since the transmittance and diffusion length both tend to decrease for high doping levels, an optimum doping level typically exists at which cell efficiency is maximized, for which the conductivity of the window 21 and emitter layer 22 is high enough that resistive losses are small compared to the power output of the cell 20, and yet the transmittance and minority-carrier collection in the window 21 and emitter layer 22 are high enough that most of the photons incident on the cell 20 generate useful current.

The highly-doped layers that form the tunnel junctions between cells, with their very low sheet resistance, may also serve as lateral conduction layers, helping to make the current density across the MJ cell 10 more uniform in the case of spatially non-uniform intensity or spectral content of the light incident on the cell. Laterally-conductive layers between the subcells 20, 40, and on the back of the bottom cell 60, can also be very important in the case of MJ cell designs which have more than two terminals, for instance, in mechanically-stacked or monolithically-grown MJ cells with 3, 4, or more terminals in order to operate the subcells at current densities that are not all necessarily the same, in order to optimize the efficiency of each subcell and hence of the entire MJ cell. Laterally-conductive regions between the subcells 20, 40 and at the back of the bottom cell 60 can also be important for configurations with 3, 4, or more terminals in which the subcells are interconnected with other circuit elements, such as bypass or blocking diodes, or in which the subcells from one MJ cell are connected with subcells in another MJ cell, in series, in parallel, or in a combination of series and parallel, in order to improve the efficiency, voltage stability, or other performance parameter of the photovoltaic cell circuit.

Note that a variety of different semiconductor materials may be used for the window layers 21, 41, 52, and 58 (the primary function of 52 is the buffer region, and the primary function of layer 58 is that of the nucleation layer, but they also serve as window layers for the bottom cell 60); the emitter layers 22, 42, 62; the base layers 24, 44, 64; and/or the BSF layers 25, 45, including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, $Ga_{1-n}N$, AlGaInN, GaInNAs, AlGaInNAs, ZnSSe, CdSSe, and other materials and still fall within the spirit of the present invention. Additionally, while the growth substrate and base layer 64 is preferably a p-Ge growth substrate and base layer, other semiconductor materials may be used as the growth substrate and base layer 64, or only as a growth substrate. These include, but are not limited to, GaAs, InP, GaSb, InAs, InSb, GaP, Si, SiGe, SiC, $Al_2O_3$, Mo, stainless steel, soda-lime glass, and $SiO_2$.

Single-Junction Photovoltaic Cells

Figure 3:
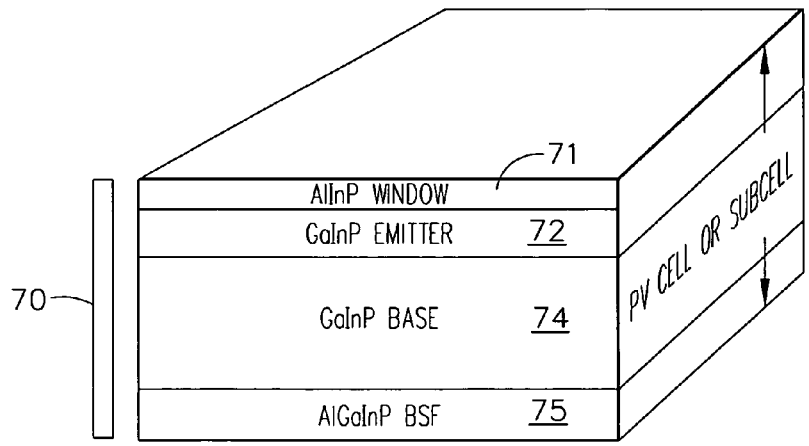
FIG. 3 is a cross sectional view of a basic semiconductor layer structure of a single-junction photovoltaic cell or of a single subcell in a multijunction photovoltaic cell according to an embodiment of the invention.

As described above, the multijunction photovoltaic cell 10 shown in FIG. 2 may comprise two or more subcells, each of which is a single-junction photovoltaic cell. FIG. 3 shows a cross-section of the basic semiconductor layer structure 70 of a single-junction photovoltaic cell, or of a single subcell of a multijunction cell, representing one embodiment of the present invention.

The photovoltaic cell 70 (and each subcell in a multijunction cell) can be composed of an emitter layer 72 of a first doping type and a base layer 74 of a second doping type. For instance, if the emitter layer 72 is n-type, then the base layer 74 is typically p-type; and if the emitter layer 72 is p-type, then the base layer 74 is typically n-type, such that a p-n junction is formed between the emitter layer 72 and base layer 74. There may be variations in the doping concentration in the emitter 72 and/or base layers 74, typically with higher doping toward the front of the emitter layer 72 and lower doping in the portion of the emitter layer 72 that is closer to the p-n junction, and higher doping toward the back of the base layer 74 and lower doping in the portion of the base layer 74 that is closer to the p-n junction, in order to suppress minority-carrier concentration at the surfaces away from the p-n junction, and enhance minority-carrier flow toward the collecting p-n junction. The base layer 74 may be intrinsic or not-intentionally-doped (nid) over part or all of its thickness.

In addition to the basic components of the emitter layer 72 and base 74, a photovoltaic cell (and each subcell in a multijunction cell) may typically include a window layer 71 on top of the emitter, and a back-surface field (BSF) layer 75 on the back of the base. The window layer typically has the same doping type as the emitter, often has a higher doping concentration than the emitter, and it is desirable for the window layer to have a higher band gap than the emitter, in order to suppress minority-carrier photogeneration and injection in the window, thereby reducing the recombination that would otherwise occur in the window. It is also highly desirable for the window layer 71 to form an interface with the emitter layer 72 with as few minority carriers and as few deep energy levels in the band gap as possible that could participate in Shockley-Read-Hall (SRH) recombination at the interface. Since crystal defects can cause these deep energy levels, the window layer 71 should be capable of forming an interface with the emitter layer 72 that has as few crystal defects as possible. This property of the window layer 71 of minimizing minority-carrier recombination at the emitter layer 72 surface is referred to as emitter passivation. Passivation is a term that has various meanings depending on the context in which it is used, but in this text it will be used to have the above meaning unless otherwise noted.

Note that a variety of different semiconductor materials may be used for the window 71, emitter 72, base 74 and/or BSF 75 layers of the photovoltaic cell, including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, $Ga_{1-n}N$, AlGaInN, GaInNAs, AlGaInNAs, ZnSSe, CdSSe, and other materials and still fall within the spirit of the present invention. In the example of FIG. 3, the photovoltaic cell window 71 is an AlInP photovoltaic cell window, the emitter 72 is a GaInP emitter, the base 74 is a GaInP base, and the back-surface field (BSF) layer 75 is an AlGaInP back-surface field layer.

The emitter layer 72 is typically thinner than the base layer 74 and positioned on the sunward side of the base layer 74, though some specialized cells also make use of back surface illumination incident on the back of the base. Most of the photogeneration of electron-hole pairs responsible for the cell current typically takes place in the base layer 74, though the photogenerated current density from the emitter layer 72 is also significant in most cells, and in some specialized cells may exceed that in the base layer 74.

The photovoltaic cell 70 may be of either a homojunction or heterojunction design. In a homojunction design, the semiconductor material in the emitter layer and base layer has the same composition, with the exception of the different doping in the emitter layer 72 and base layer 74, and the same semiconductor band gap. The example shown in FIG. 3 is a homojunction cell. In a heterojunction design, the semiconductor material in the emitter layer has a different composition than that of the base layer, and/or has a different band gap than that of the base layer, in addition to the different doping types in the emitter layer and base layer. The emitter layer composition in a heterojunction photovoltaic cell design is typically chosen such that the emitter layer has a higher band gap than the base layer, in order to inhibit injection of the majority carriers in the base layer into the emitter layer (where they are minority carriers that can recombine, since the emitter layer and base layer are of opposite doping type), and in order to transmit more light through the emitter layer to the base layer before the light is absorbed to create electron-hole pairs.

In some specialized cells, a thin, often intrinsic layer (not shown) may be placed between the emitter layer 72 and base layer 74, which may have the same composition as either the emitter layer 72 and/or the base layer 74, or may have a composition that is distinct from either. This thin layer at the p-n junction, often called an 'intrinsic layer' if it is undoped, can serve to suppress shunting at the p-n junction, and can reduce the interface state density at the p-n junction in order to suppress minority-carrier recombination in the space-charge region. Similar to the base layer 74, the emitter layer 72 may also be intrinsic or not-intentionally-doped (nid) over part or all of its thickness, but if this intrinsic or nid region is positioned adjacent to the p-n junction, it is typically considered part of the base layer 74 or as a separate 'intrinsic layer', described above, between the base layer 74 and emitter layer 72.

The BSF layer 75 is analogous to the window layer 71 in that the BSF layer 75 may passivate the base layer 74 of the photovoltaic cell 70. The BSF layer 75 typically has the same doping type as the base layer 74, often has a higher doping concentration than the base layer 74, and it is desirable for the BSF layer 75 to have a higher band gap than the base layer 74, to suppress minority-carrier photogeneration and injection in the BSF layer 75, to reduce recombination in the BSF layer 75, and if the photovoltaic cell 70 is a subcell in a multijunction cell that is positioned above other active subcells in the multijunction cell stack, in order to transmit more light through the BSF layer 75 to the active subcells beneath where the photogenerated electron-hole pairs can be collected more efficiently.

Note that although the window layer 71, the emitter layer 72, the base layer 74, and the BSF layer 75 in the photovoltaic cell 70 in FIG. 3 are shown as single layers, each of these layers may comprise more than one layer, with different composition, band gap, growth method, or other distinguishing characteristic. For example, the window of the Ga(In)As-base middle cell in a multijunction cell 10, as depicted in FIG. 2, may consist of a GaInP first window layer, and an AlInP second window layer with higher band gap than the GaInP first window layer, in order to passivate (reduce minority-carrier recombination at) the upper surface of the GaInP first window layer.

Figure 4:
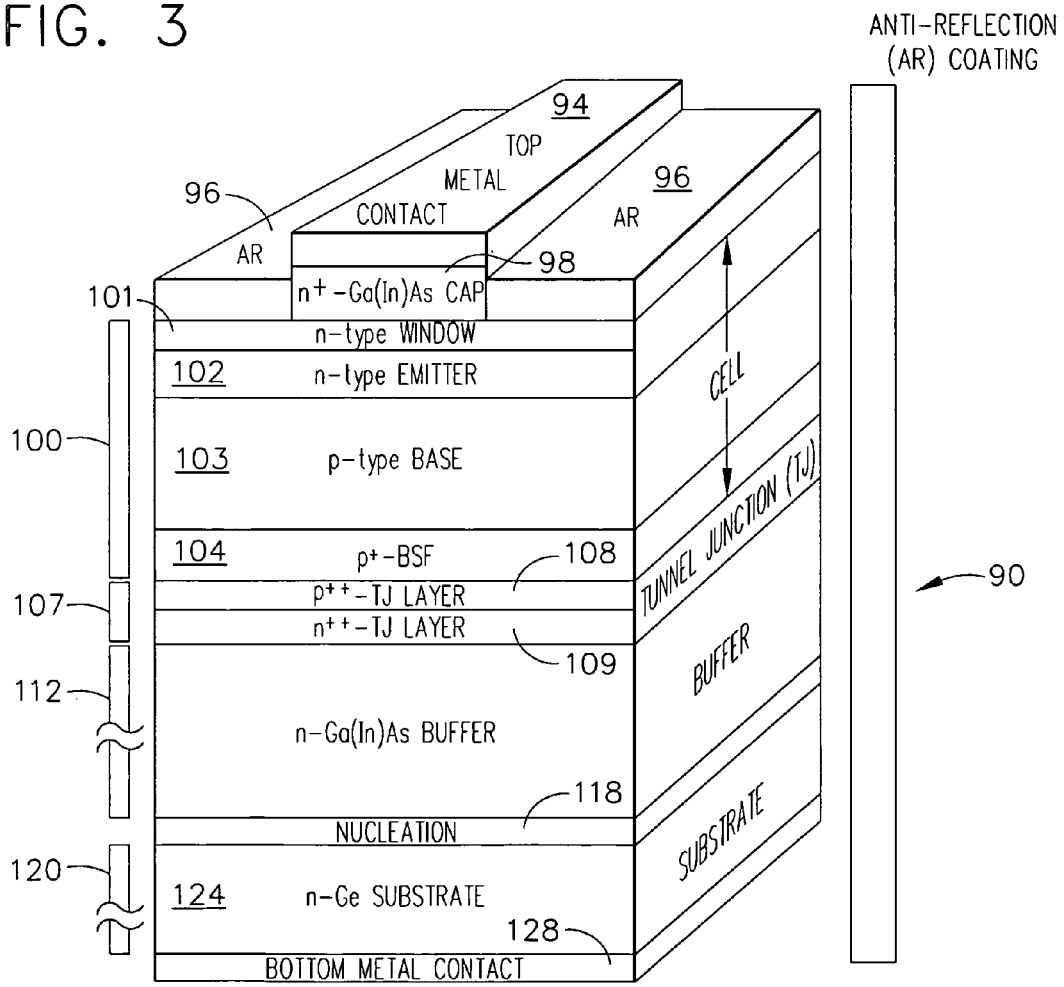
FIG. 4 is a cross sectional view of a single-junction photovoltaic cell according to an embodiment of the invention.

In order to be used practically, the basic semiconductor layer structure of a photovoltaic cell 70 such as the example shown in FIG. 3 should be used in a complete device, as in the example of a multijunction cell 10 in FIG. 2, or as in the example of a single-junction cell 90 shown in FIG. 4.

In the complete multijunction (MJ) device 10, an anti-reflection (AR) coating 16 is typically provided on its front (sunward) surface, typically made up of one, two, or more dielectric layers with thickness' optimized to maximize transmission of light through the front surface over the range of wavelengths to which the MJ photovoltaic cell 10 is responsive. Similarly, the complete single-junction device 90 typically has an AR coating 96.

When used in a complete device such as the MJ cell 10 or the single-junction cell 90, the basic semiconductor layer structure 70 of a photovoltaic cell typically has structures deposited on, attached to, or otherwise added to it that allow it to be electrically connected to an external circuit. In the MJ cell 10, these can include a heavily-doped cap contacting layer 18 on top of the window layer 21 of the top GaInP subcell 20, and a metal contact 14 on top of the cap layer 18, forming the top contact structure of the MJ cell 10. Similarly, the single-junction cell 90 can have a heavily-doped cap contacting layer 98 and a metal contact 94 that form the top contact structure. The back contact structure of the MJ cell 10 may include a bottom metal contact 68 on the bottom of the Ge subcell and substrate 60, and may or may not include a heavily-doped region at the back of the Ge subcell and substrate 60 to decrease the specific contact resistance at the interface with the bottom metal contact 68. Similarly, the single-junction cell 90 can have a bottom metal contact 128.

Additionally, complete devices such as the MJ cell 10 or the single-junction cell 90 typically have structures that allow the basic semiconductor layer structure 70 of a photovoltaic cell to be connected electrically to other layers within the MJ cell 10 or single-junction cell 90, and which also typically interact optically with those other layers, as well as with the basic semiconductor layer structure 70. For example, in the MJ cell 10, these layers may include a tunnel junction 27 used to connect the top cell 20 to the middle cell 40, and a tunnel junction 47 used to connect the middle cell 40 to a buffer region 52, connected to a nucleation layer 62, connected to the bottom subcell 60, which is connected to the bottom metal contact 68. The tunnel junction 27 may be preferably composed of a heavily-doped $p^{++}$ semiconductor layer 28 and a heavily-doped $n^{++}$ semiconductor 29. The band gap or band gaps of the tunnel junction layers 28 and 29 are preferably greater than the band gap or band gaps of the main absorbing layers in the active subcell(s) beneath the tunnel junction structure 27, in order to transmit more light to the active subcells beneath, such as the Ga(In)As middle subcell 40. For example, the $p^{++}$ tunnel junction layer 28 may be AlGaAs doped with carbon, and the $n^{++}$ tunnel junction layer 29 may be GaInP doped with tellurium. The tunnel junction 47 may also be preferably composed of a $p^{++}$ layer 48 and an $n^{++}$ layer 49, and can also preferably have band gap(s) greater than the subcell(s) beneath it, such as the Ge subcell 60. For example, the $p^{++}$ tunnel junction layer 48 may be GaAs doped with carbon, and the $n^{++}$ tunnel junction layer 49 may be GaAs doped with tellurium. Similarly, in the complete single-junction device 90, the basic semiconductor layer structure 100 of the photovoltaic cell is connected by a tunnel junction 107 to a buffer region 112, connected to a nucleation layer 118, connected to the inactive Ge substrate 120, which is connected to the bottom metal contact 128. As shown in FIG. 4, the basic semiconductor layer structure 100 may include a window layer 101, an emitter layer 102, a base layer 103, and a back-surface field (BSF) layer 104. The tunnel junction 107 may include a $p^{++}$-doped layer 108 and an $n^{++}$-doped layer 109. The substrate 120 may be a n-Ge base layer 124 that serves as a growth substrate and a mechanical support for the rest of the cell 90.

In one aspect of the present invention, a process is provided for reducing the density and/or propagation of defects (i.e., threading dislocations) that might otherwise exist in a III-V material device. The particular material system for the III-V device may vary and can include, for example, GaInAs, GaInP, AlGaAs AlGaP, GaInAsP, GaInAsSb, AlInAsSb, AlGaAsP, GaInAsSb, AlInPSb, AlGaPSb, and GaInPSb. More specifically, the present invention can be particularly useful in GaInP/GaInAs/Ge devices, including those where the In content of the GaInAs layer is between about 2% and 30%. The GaInP layers can be either lattice-matched or lattice-mismatched to the lower layers. Another particularly useful device is one of GaInP/GaInAs/Si wherein a GaInP buffer layer is used in varying the In content of GaInAs from 0% to 50%.

The device of the present invention may be a metamorphic one wherein a III-V epitaxial device layer is lattice-matched to a substrate and is partially or completely relaxed with respect to the substrate The present process includes the use of an isoelectronic surfactant introduced into strained buffer layers of a buffer region that can exist between a substrate and device layer. The isoelectronic surfactant is intended to allow relaxation inside one or more of the buffer layers which are disposed away from the device layer or region. The reference to "isoelectronic" is intended to refer to the characteristic of the surfactant not acting as a dopant in the layer. In other words, the isoelectronic surfactant of the present invention does not have the intended effect of changing the free-electron concentration as in conventional surfactant doping. Rather, the isoelectronic surfactant mediates the manner in which relaxation occurs by acting to slow the nucleation of dislocation loops, thus the edge segments become as large as possible with minimal creation of threading dislocation segments. The epitaxial growth of the buffer region in the present invention may take the form of a liquid to solid condensate process such as liquid phase epitaxy (LPE), a ultra-high vacuum gas to solid decomposition such as molecular beam epitaxy (MBE), or a low pressure or near atmospheric pressure vapor phase epitaxy such as metalorganic vapor phase epitaxy (MOVPE). The isoelectronic surfactant may include an element that will not readily incorporate into the grown solid, but still has a low vapor pressure such that it may not evaporate readily from the surface of the epitaxial buffer layer. In one embodiment, Sb can be used as the surfactant atom. Many other atoms in III-V semiconductor epitaxy may also qualify as surfactants. Typically in III-V semiconductors, they are other group-III or group-V elements that do not readily incorporate into the host solid and may include Sb, Bi, Tl or B for example or even As if the solid solubility is low enough to adequately produce the surfactant effect. This list is not exclusive and may include other elements.

Figure 5:
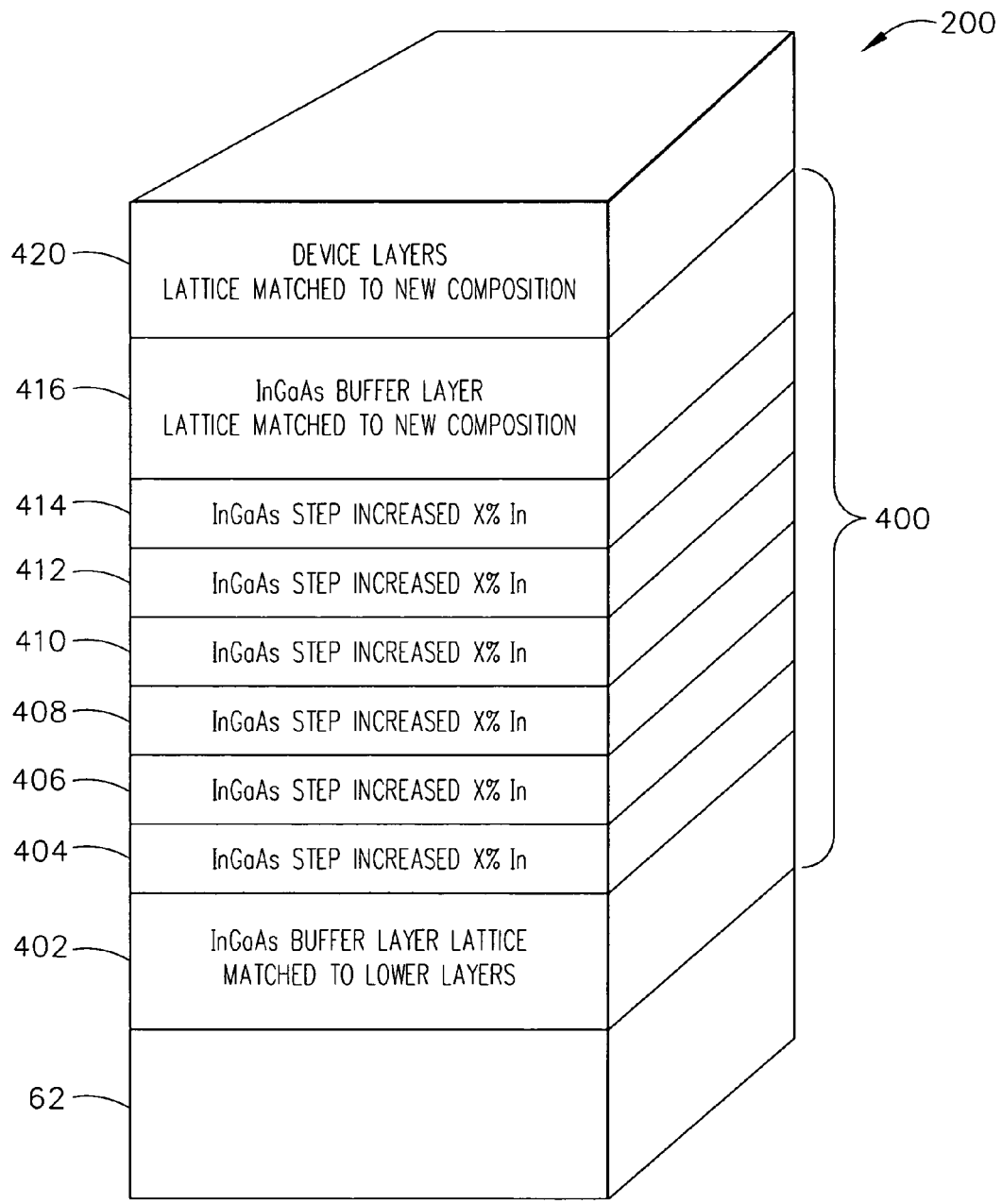
FIG. 5 is a cross sectional view of a buffer layer according to an embodiment of the invention.

In an embodiment of the present invention, a metamorphic device 200 can include a plurality of epitaxial buffer layers 402 to 416 of a buffer region 400, as illustrated in FIG. 5. A first or lowermost buffer layer 402 of the buffer region 400 may be grown lattice-matched to the substrate 62. Likewise, a second or uppermost buffer layer 416 of the buffer region 400 may be grown lattice-matched to a device layer 420. Between the lowermost and uppermost buffer layers 402, 416 may be a plurality of third or intermediate buffer layers 404, 406, 408, 410, 412, and 414. Although the intermediate buffer layers of FIG. 5 are shown as six layers, the number used for any specific application may be fewer or greater.

The intermediate buffer layers 404 to 414 may be grown with increasing (or decreasing) weight percentages of one or more elements in the composition of the buffer layers. The weight percentage in each intermediate buffer layer can change by a same or differing amount, even though FIG. 5 only illustrates the same change. The weight percentage change can occur until the composition of the uppermost buffer layer 416 is lattice-matched to an immediately adjacent device layer 420. For example, in the case of an InGaAs buffer region 400, the concentration of $In$ may be increased in a stepped fashion from the lowermost intermediate buffer layer 404 to the uppermost intermediate buffer layer 414. A top InGaAs buffer layer 416 may then be lattice matched to a composition of the device layer 420.

Those skilled in the art will recognize that that the In content, as an example, may be smoothly or uniformly graded in an increasing or decreasing fashion, as opposed to a stepped fashion. Such a smooth gradation (either increasing or decreasing) may be accomplished in a liner, parabolic, and exponential fashion, as an example.

In another aspect of the present invention, a process includes a step of introducing an isoelectronic surfactant during the epitaxial growth of one or more of the layers 402-416. The surfactant may be provided in the form of one or more precursors, such as TESb (triethlylantimony). In turn, the same or a different precursor may be introduced during the growth of one or more of the buffer layers 402 to 416, either during a pause in the growth of a single buffer layer or at the start of the growth of the single buffer layer. The isoelectronic surfactant in the form of the precursor may then be allowed to desorb prior to the growth of the next layer, which can be another buffer layer or the device layer 420.

More specifically, the amount of isoelectronic surfactant to group-III (surfactant/III(v)) may vary from about $1 \times 10^{-5}$ to $1 \times 10^5$, and preferably from about 0.001 to 1.0. As an example, with Sb as the surfactant and an InGaAs buffer region, the molar ratio of Sb to Ga and In in the vapor phase may be approximately 0.05 to 0.07. The isoelectronic surfactant provides a way to allow relaxation not only of an InGaAs buffer layer but also other III-V semiconductors such as GaInAs, GaAsSb, GaPAs, GaInPAs, AlInP, AlGaInP, AlGaAs, AlGaInAs, AlGaAsSb, AlGaPAs AlInAs, InPAs, AlInPAs, InGaAsN, InGaPN, InGaAsPN, SiGe, CdZnSe, CdZnTe, ZnSSe, ZnSeTe, CuGaInSe, CuGaInSSe, and AgGaInSe.

As mentioned above, the isoelectronic surfactant can be introduced during a first pause in the growth of a buffer layer. The pause in the process can be about 0.01 to 5 minutes and preferably about 0.5 minutes. In any event, the pause is of an amount that can allow for a substantial surface concentration of surfactant to build prior to growth of the following layers. The surfactant in the form such as TESb can be introduced at a same flow rate for growth of the buffer layer.

In the example of the buffer layers grown with TESb as the surfactant, the TESb may be present according to the molar ratio of TESb/(TMGa+TMIn) wherein the ratio may vary from about 0.01 to 0.1, and preferably equal about 0.05, as an example. Next, the TESb can be turned off to allow it's desorption during a second pause that may be about 0.1 to 5 minutes and preferably about 0.5 minutes. The amount of desorption can vary from about 0 to 100%, and is preferably about 100%.

Similar to the embodiment shown in FIG. 5, an isoelectronic surfactant may be introduced before growth of a strained layer or alternatively, during a growth pause before growth of the strained layer. For example, the isoelectronic surfactant may be used to grow the buffer layer 402 as described above. The surfactant may then be removed after the strained layer has been grown.

Moreover, the present invention contemplates that there may be multiple metamorphic buffer regions between multiple cells of a device. For example, a solar cell may include an upper cell; a middle cell below the upper cell; an upper metamorphic buffer layer below the middle cell, with the upper metamorphic buffer layer being grown in the presence of one of a first isoelectronic surfactant and a second isoelectronic surfactant; a lower cell below the upper metamorphic buffer layer; a lower metamorphic buffer layer below the lower cell, with the lower metamorphic buffer layer grown in the presence of one of the first and second isoelectronic surfactants; and a substrate below the lower metamorphic buffer layer. The first and second isoelectronic surfactants can be the same or different.

Further, in the above exemplary device with multiple metamorphic regions, the upper cell can be composed of $Ga_xIn_{1-x}P$ and x is chosen such that layers of the upper cell are substantially lattice matched to the middle cell. The middle cell can be composed of one of $Ga_xIn_{1-x}As$ and $Ga_xIn_{1-x}As_yP_{1-y}$, and x and y are chosen such that a band gap of the middle cell is between 1.3 eV and 1.8 eV. The upper metamorphic buffer layer can be graded in composition such that uppermost layers of the upper metamorphic layer are substantially lattice matched to the upper cell. The lower cell can be composed of one of GaInAsN, GaInAs, GaInAsNP, and BGaInAs, and can be lattice mismatched to the substrate and a band gap of the lower cell is between 0.6 eV and 1.3 eV. The lower metamorphic buffer layer can be graded in composition and lattice matched to the substrate such that uppermost layers of the lower metamorphic buffer layer are substantially lattice matched to the lower cell. A Ge bottom cell can also be below the lower metamorphic buffer layer.

Alternatively, the device of the present invention can include metamorphic buffer layers (MMBL) grown with an isoelectronic surfactant such that an MMBL is between a upper and middle cells and between a lower cell and substrate. Another alternative could include an MMBL between upper and middle cells, a second MMBL between middle and lower cells, and a third MMBL between the lower cell and substrate. The foregoing examples, however, are not intended to limit the scope of the present invention.

EXAMPLES

Monolithic 2-junction metamorphic GainP/GaInAs/Ge solar cells with a middle cell 40 indium content of 12% In and the middle-cell-active-only (isocells) were fabricated and tested as described below.

Figure 6A:
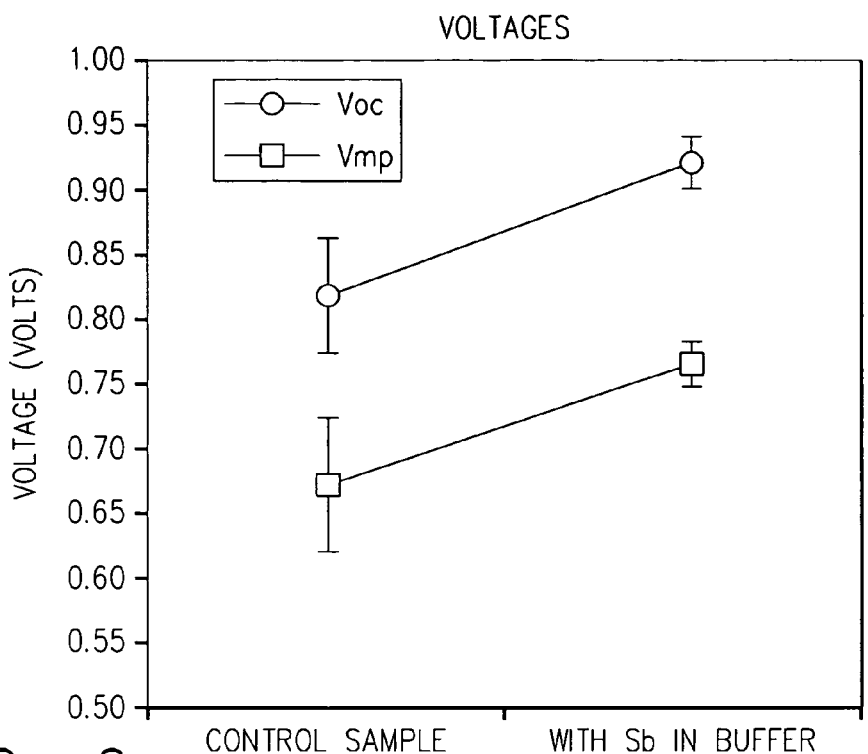
FIGS. 6*a*, 6*b* and 6*c* are graphical illustrations showing the performance of an optoelectronic device according to an embodiment of the invention.
Figure 6B:
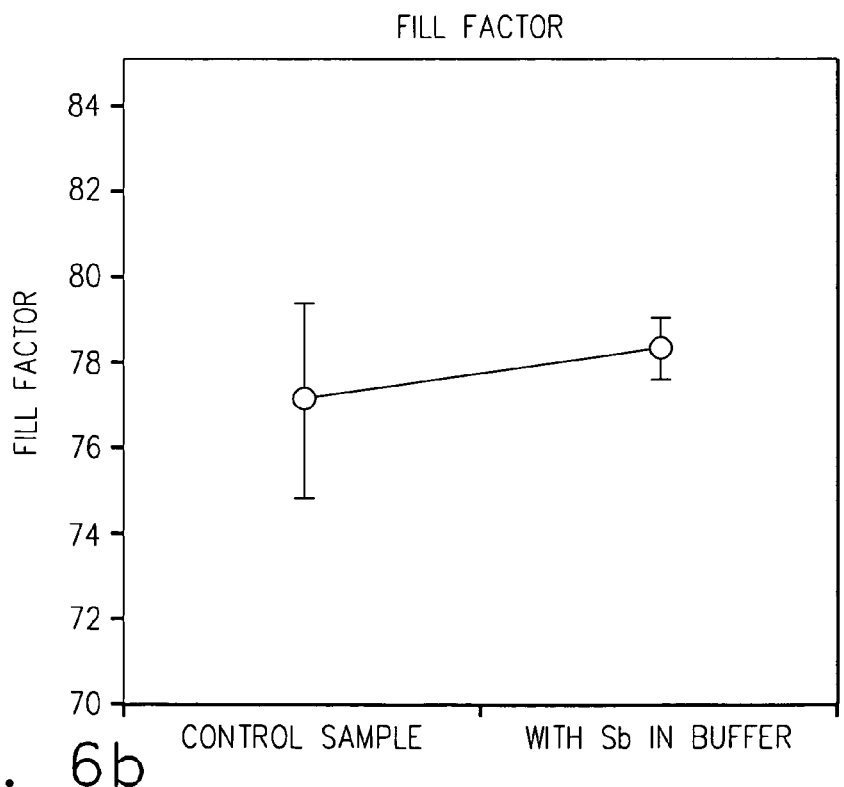
Figure 6C:
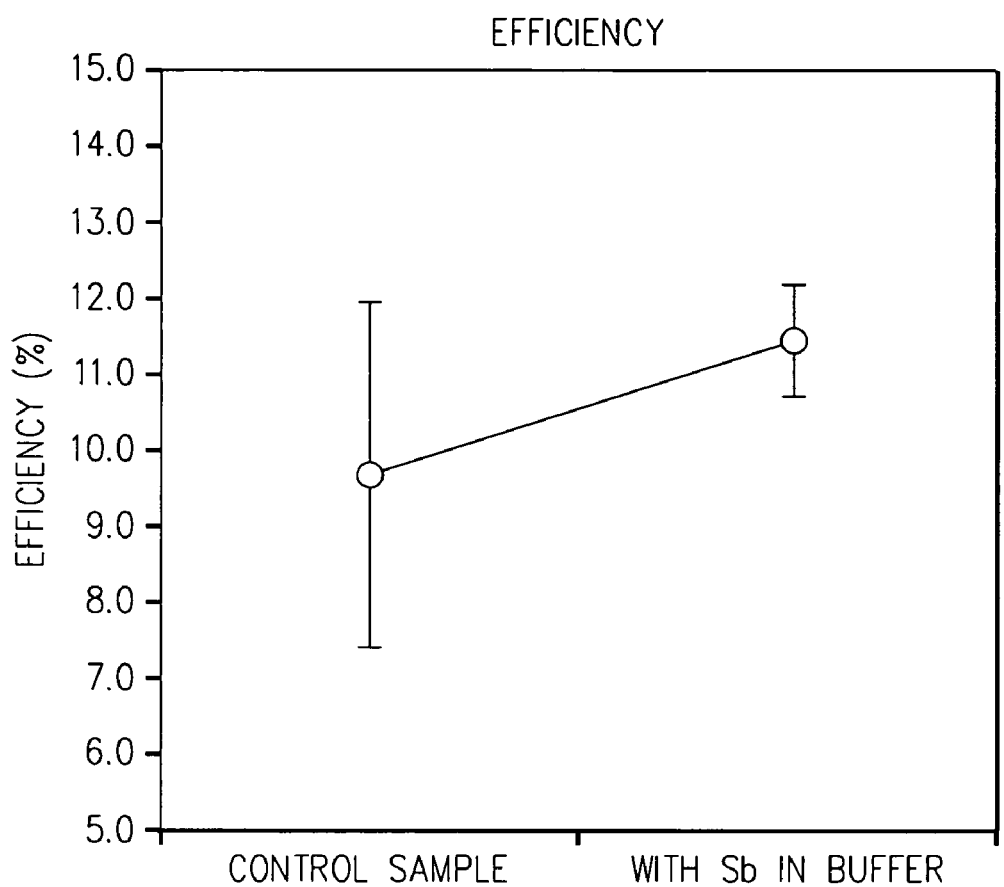

Using the structure depicted in FIG. 2, non-anti-reflective coated 1 cm×1 cm cells were fabricated and tested for the condition of Sb in the buffer layer 52 as compared to samples grown without Sb in the buffer layer 52. The cells fabricated were in a dual-junction configuration with the top cell electrically deactivated for both conditions by growing the top cell layers with the same doping type (isotype top cell layers). The measured open-circuit voltage ($V_{oc}$) voltage at maximum power ($V_{mp}$), fill factor (FF) and efficiency are shown in FIGS. 6*a-c*. Error bars shown are plus and minus one times the standard deviation for the entire cell population tested.

The addition of Sb to the buffer layer 52 resulted in an increase of approximately 100 mV in $V_{oc}$ as compared to the control cells as shown in FIG. 6*a*. This improvement is an approximately 12% relative improvement in voltage over the no-Sb control samples. Additionally, there is an improvement in performance of approximately 100 mV in $V_{mp}$ when Sb is added to the buffer layer 52 of the structure. FIG. 6*a* also demonstrates a decrease in variability in both voltages when Sb is added to the buffer layer 52, as indicated by the decreased standard deviation. The gains in voltage with Sb are also accompanied by an increase in fill factor from 77% without Sb to 78%, as depicted in FIG. 6*b*. Again the same decrease in variability is also observed in the fill factor. The currents in each case were identical with and without Sb. As shown in FIG. 6*c*, the increased $V_{oc}$ and fill factor combined with the identical current leads to an average efficiency of 11.3% for the Sb-modified cells as compared to 9.7% average efficiency for the control cells. Again there is a reduction in variability in efficiency for the Sb-modified cells. This is a 1.8% absolute gain in corresponding to a 16.5% relative gain in efficiency and power output.

By some simple assumptions of the relations between minority carrier lifetime and threading dislocation density, this increase in $V_{oc}$ may be related to a decrease in threading dislocation density in the active areas of the device. One may assume that the saturation current density is inversely proportional to the minority carrier lifetime. Therefore the saturation current density is directly proportional to the threading dislocation density. The resulting increase of 100 mV in open circuit voltage then correlates to a factor of 25 decrease in threading dislocation density by using Sb in the buffer layer as compared to the control.

The performance of full triple-junction cells may also be estimated from this experiment. We may assume that a loss of only 100 mV occurs from each top and middle cell and a gain of 3 mA/cm² in short circuit current density over the lattice-matched structure occurs with the use of Sb in the buffer of a 12% In metamorphic 3J cell. Given that the lattice matched structure has achieved 29.7% efficiency at 1 sun, AM0 with 2.712 V ($V_{oc}$), 17.21 mA/cm² (J), and 86.0% (FF), the metamorphic 3J with Sb then with the same fill factor would achieve a 31.7% efficient cell under the same conditions. This estimate represents a 2.0% absolute improvement in beginning-of-life AM0, 1 sun performance over the current best recorded performance of 29.7% efficient lattice-matched GaInP/GaInAs/Ge 3J cell [R. R. King, C. M. Fetzer, P. C. Colter, K. M. Edmondson, J. H. Ermer, H. L Cotal, H. Yoon, A. P. Stavrides, G. Kinsey, D. D. Krut, and N. H. Karam, "High-Efficiency Space and Terrestrial Multijunction Solar Cells Through Bandgap Control in Cell Structures," *Proc. 29th IEEE Photovoltaic Specialists Conf.*, May 20-24 2002].

It should be understood, of course, that the foregoing relates to preferred embodiments of the invention and that modifications may be made without departing from the spirit and scope of the invention as set forth in the following claims.

We claim:

1. A solar cell having a III-V material system, comprising:
   a substrate;
   an isoelectronic surfactant, buffer region disposed on the substrate;
   said buffer region being relaxed in the presence of said surfactant; and
   a device layer disposed in such manner that said buffer region is disposed intermediate said substrate and device layer.

2. The solar cell of claim 1, further comprising at least one metamorphic subcell.

3. The solar cell of claim 1, wherein said buffer region includes a plurality of buffer layers.

4. The solar cell of claim 1, wherein said buffer region comprises a changing material composition between a lowermost portion to an uppermost portion of said buffer region.

5. The solar cell of claim 4, wherein said changing material composition comprises an increasing concentration of an element in said material composition.

6. The solar cell of claim 4, wherein said changing material composition comprises a decreasing concentration of an element in said material composition.

7. The solar cell of claim 1, wherein said buffer region further comprises a first buffer layer lattice matched to said substrate.

8. The solar cell of claim 7, wherein said buffer region further comprises a top buffer layer lattice matched to said device layer.

9. The solar cell of claim 1, wherein said device layer is lattice mismatched to said substrate.

10. A satellite system comprising:
a satellite; and
a solar cell array having a solar cell that includes:
   a substrate;
   an isoelectronic surfactant, buffer region disposed on said substrate;
   said buffer region being relaxed in the presence of said surfactant without changing a free-electron concentration in said buffer region; and
   a device layer disposed in such manner that said buffer region is disposed intermediate said substrate and device layer.

11. The satellite system of claim 10, wherein said device layer is lattice matched to said substrate.

12. The satellite system of claim 10, wherein said device layer is lattice mismatched to said substrate.

13. The satellite system of claim 10, wherein said solar cell is a metamorphic one.

14. The satellite system of claim 13, wherein said buffer region includes a plurality of buffer layers.

15. The satellite system of claim 14, wherein said buffer region comprises a stepped changing material composition between a lowermost portion to an uppermost portion of said buffer region.

16. The satellite system of claim 14, wherein said buffer region comprises a smooth changing material composition between a lowermost portion to an uppermost portion of said buffer region.

17. The satellite system of claim 14, wherein said solar cell comprises a III-V material system.

18. The satellite system of claim 17, wherein said material system comprises GaInP/GaInAs/Ge.

19. The satellite system of claim 18, wherein an In content of GaInAs is between about 2% and 30%.

20. The satellite system of claim 19, wherein said GaInP is lattice matched or lattice mismatched to said GaInAs.

21. The satellite system of claim 17, wherein said material system comprises GaInP/GaInAs/Si.

22. The satellite system of claim 21, wherein an In content of GaInAs is between about 0% and 50%.

23. The satellite system of claim 22, wherein said GaInP is lattice matched or lattice mismatched to said GaInAs.

24. A solar cell comprising:
an upper cell;
a middle cell below said upper cell;
an upper metamorphic buffer layer below said middle cell, said upper metamorphic buffer layer being grown in the presence of one of a first isoelectronic surfactant and a second isoelectronic surfactant;
a lower cell below said upper metamorphic buffer layer;
a lower metamorphic buffer layer below said lower cell, said lower metamorphic buffer layer grown in the presence of one of said first and second isoelectronic surfactants; and
a substrate below said lower metamorphic buffer layer.

25. The device of claim 24, wherein the upper cell is composed of $Ga_xIn_{1-x}P$ and x is chosen such that layers of said upper cell are substantially lattice matched to the middle cell.

26. The device of claim 24, wherein the middle cell is composed of one of $Ga_xIn_{1-x}As$ and $Ga_xIn_{1-x}As_yP_{1-y}$, and x and y are chosen such that a band gap of the middle cell is between 1.3 eV and 1.8 eV.

27. The device of claim 24, wherein the upper metamorphic buffer layer is graded in composition such that uppermost layers of the upper metamorphic layer are substantially lattice matched to the upper cell.

28. The device of claim 24, wherein the lower cell is composed of one of GaInAsN, GaInAs, GaInAsNP, and BgaInAs, and is lattice mismatched to the substrate and a band gap of the lower cell is between 0.6 eV and 1.3 eV.

29. The device of claim 24, where the lower metamorphic buffer layer is graded in composition and lattice matched to the substrate such that uppermost layers of the lower metamorphic buffer layer are substantially lattice matched to the lower cell.

30. The device of claim 24, further comprising a Ge bottom cell below said lower metamorphic buffer layer.

31. A solar cell comprising:
an upper cell;
an upper metamorphic buffer layer below said upper cell, said upper metamorphic buffer layer being grown in the presence of one of a first isoelectronic surfactant and a second isoelectronic surfactant;
a middle cell below said upper metamorphic buffer layer;
a lower cell below said middle cell;
a lower metamorphic buffer layer below said lower cell, said lower metamorphic buffer layer being grown in the presence of one of said first and second isoelectronic surfactants; and
a substrate below said lower metamorphic buffer layer.

32. The device of claim 31, wherein the upper cell is composed of $Ga_xIn_{1-x}P$.

33. The device of claim 31, wherein the upper metamorphic buffer layer is graded in composition such that uppermost layers of the upper metamorphic buffer layer are substantially lattice matched to the upper cell.

34. The device of claim 31, wherein the middle cell is composed of one of $Ga_xIn_{1-x}As$ and $Ga_xIn_{1-x}As_yP_{1-y}$, and x and y are chosen such that a band gap of the middle cell is between 1.3 eV and 1.8 eV.

35. The device of claim 31, wherein the lower cell is composed of one of GaInAsN, GaInAs, GaInAsNP, and BgaInAs, and is lattice mismatched to the substrate, and the band gap of the lower cell is between 0.6 eV and 1.3 eV.

36. The device of claim 31, wherein the lower metamorphic buffer layer is graded in composition and lattice matched to the substrate such that uppermost layers of the lower metamorphic buffer layer are substantially lattice matched to the lower cell.

37. The device of claim 31, further comprising a Ge bottom cell below said lower metamorphic buffer layer.

38. A solar cell comprising:
an upper cell;
a first upper metamorphic buffer layer below the upper cell, said first upper metamorphic buffer layer being grown in the presence of one of a first isoelectronic surfactant and a second isoelectronic surfactant;
a middle cell below said upper metamorphic buffer layer;
a second upper metamorphic buffer layer below the middle cell, said second upper metamorphic buffer layer being grown in the presence of one of said first and second isoelectronic surfactants;
a lower cell below said second upper metamorphic buffer layer;
a lower metamorphic buffer layer grown in the presence of one of said first isoelectronic surfactant, said second isoelectronic surfactant, and a third isoelectronic surfactant; and
a substrate below said lower metamorphic buffer layer.

39. The device of claim 38, wherein the upper cell is composed of $Ga_xIn_{1-x}P$.

40. The device of claim 38, wherein the first upper metamorphic buffer layer is graded in composition such that uppermost layers of said first upper metamorphic buffer layer are substantially lattice matched to the upper cell.

41. The device of claim 38, wherein the middle cell is composed of one of $Ga_xIn_{1-x}As$ and $Ga_xIn_{1-x}As_yP_{1-y}$, and $x$ and $y$ are chosen such that a band gap of the middle cell is between 1.3 eV and 1.8 eV.

42. The device of claim 38, wherein the second upper metamorphic buffer layer is graded in composition such that uppermost layers of said second upper metamorphic buffer layer are substantially lattice matched to the middle cell.

43. The device of claim 38, wherein the lower cell is composed of one of GaInAsN, GaInAs, GaInAsNP, and BgaInAs, and is lattice mismatched to the substrate and the band gap of the lower cell is between 0.6 eV and 1.3 eV.

44. The device of claim 38, wherein the lower metamorphic buffer layer is graded in composition and lattice matched to the substrate such that uppermost layers of the lower metamorphic buffer layer are substantially lattice matched to the lower cell.

* * * * *